(12) United States Patent
Schmitz et al.

(10) Patent No.: US 10,622,772 B2
(45) Date of Patent: Apr. 14, 2020

(54) CONTACT AND BUSBAR ASSEMBLY, ELECTRONICS HOUSING ASSEMBLY HAVING SUCH A CONTACT AND BUSBAR ASSEMBLY, AND METHOD FOR REMOVING AN ELECTRONICS HOUSING FROM SUCH AN ELECTRONICS HOUSING ASSEMBLY

(71) Applicant: Weidmüller Interface GmbH & Co. KG, Detmold (DE)

(72) Inventors: Till Schmitz, Detmold (DE); René Arntzen, Osnabrück (DE); Volker Schröder, Lemgo (DE); Peter Stuckmann, Lage (DE)

(73) Assignee: Weidmüller Interface GmbH & Co. KG (DE)

( * ) Notice: Subject to any disclaimer, the term of this patent is extended or adjusted under 35 U.S.C. 154(b) by 0 days.

(21) Appl. No.: 16/281,166

(22) Filed: Feb. 21, 2019

(65) Prior Publication Data

US 2019/0260170 A1    Aug. 22, 2019

(30) Foreign Application Priority Data

Feb. 21, 2018  (DE) .................... 20 2018 100 964 U
Jan. 25, 2019  (DE) ........................ 10 2019 101 859

(51) Int. Cl.
*H01R 25/16* (2006.01)
*H01R 43/00* (2006.01)
(Continued)

(52) U.S. Cl.
CPC ......... *H01R 25/164* (2013.01); *H01R 12/716* (2013.01); *H01R 25/162* (2013.01);
(Continued)

(58) Field of Classification Search
CPC ... H01R 13/514; H01R 31/085; H01R 9/2675
See application file for complete search history.

(56) References Cited

U.S. PATENT DOCUMENTS 8,585,422 B2 * 11/2013 Balcerak ............. H01R 9/2675
439/215
8,961,201 B2 *  2/2015 Griese ................. H01R 9/2675
439/121

(Continued)

FOREIGN PATENT DOCUMENTS

DE      2731850 A1     1/1979
DE   202013103444 U1  11/2014
DE   102017116342 A1   2/2018

*Primary Examiner* — Tho D Ta
(74) *Attorney, Agent, or Firm* — Laubscher & Laubscher, P.C.

(57) ABSTRACT

A contact and busbar assembly forms a bus system on electronics housings arranged in an array direction. Each housing includes a circuit board. The contact and busbar assembly includes multiple bus plugs having first connecting contacts for electrically contacting the circuit boards and second connecting contacts in the form of socket contacts for electrically contacting power rail strips. A plurality of power rail strips electrically connects the second connecting contacts of adjacent electronics housings. A first power rail strip electrically connects the bus plugs of two directly adjacent electronics housings and a second power rail strip of greater length electrically connects two spaced electronics housings. An electronics housing assembly is provided having multiple electronics housings arranged against one another in the array direction and a contact and busbar assembly as set forth above. A method for removing or replacing an electronics housing arranged between two adjacent electronics housings of such an electronics housing assembly is also provided.

8 Claims, 13 Drawing Sheets

(51) Int. Cl.
*H01R 12/71* (2011.01)
*H01R 12/73* (2011.01)
*H01R 31/08* (2006.01)
*H01R 9/26* (2006.01)
*H01R 13/514* (2006.01)

(52) U.S. Cl.
CPC ........... *H01R 43/00* (2013.01); *H01R 9/2675* (2013.01); *H01R 12/73* (2013.01); *H01R 13/514* (2013.01); *H01R 31/085* (2013.01)

(56) References Cited

U.S. PATENT DOCUMENTS

| | | |
|---|---|---|
| 10,050,394 B2 | 8/2018 | Aporius et al. |
| 2003/0040215 A1 | 2/2003 | Kleen |
| 2012/0264317 A1 | 10/2012 | Blacerak |
| 2014/0073204 A1 | 3/2014 | Ramey et al. |

\* cited by examiner

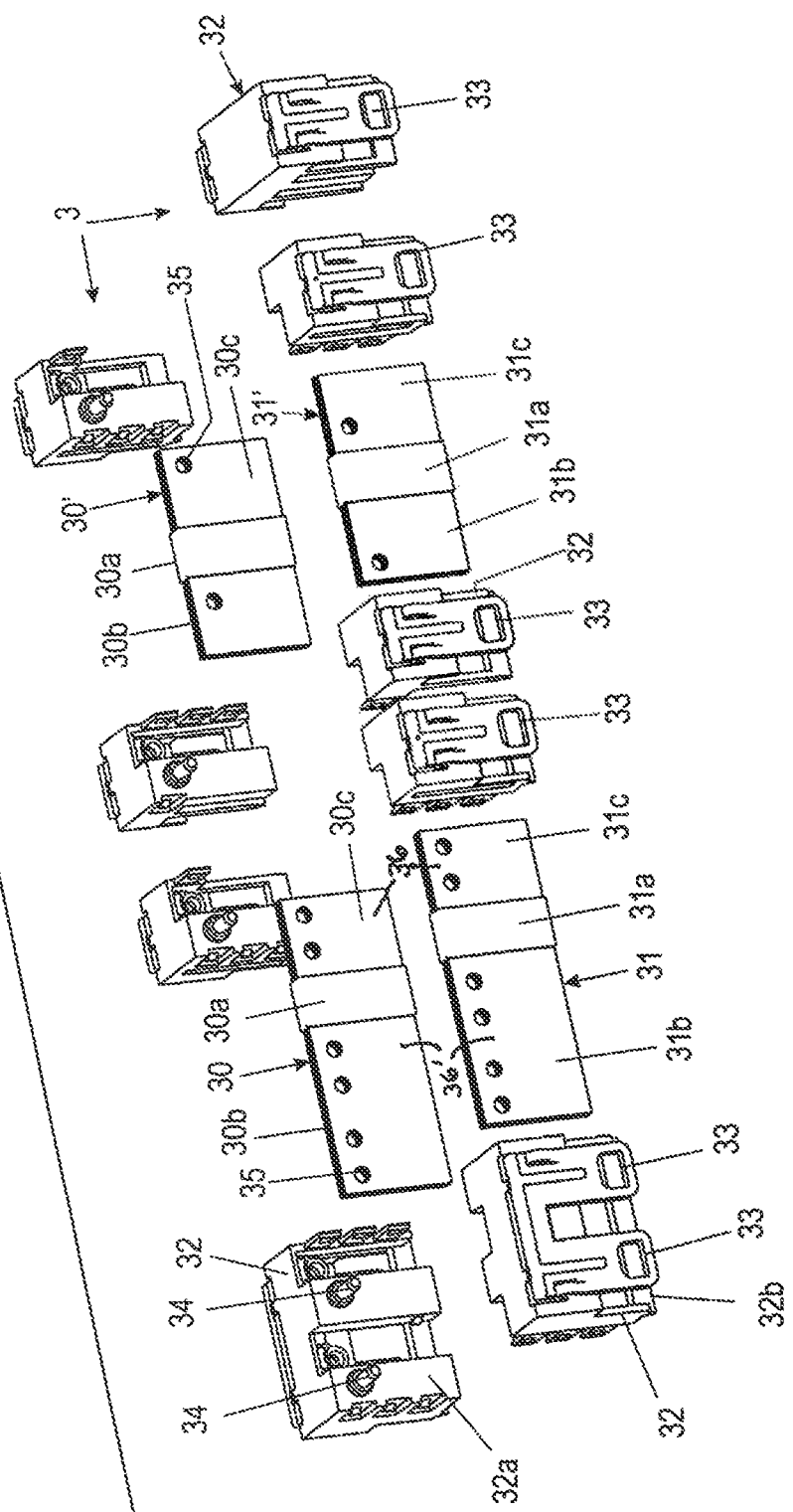

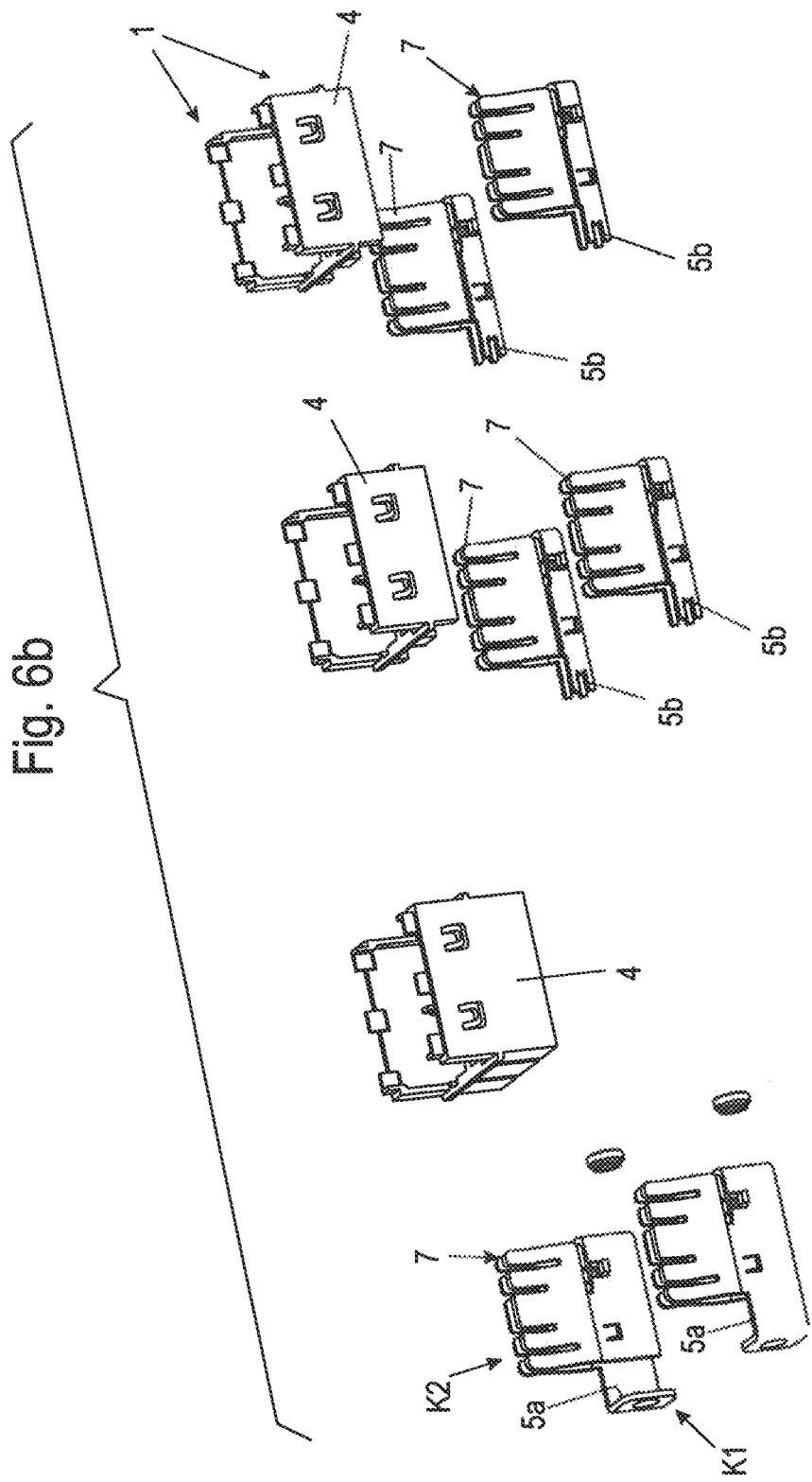

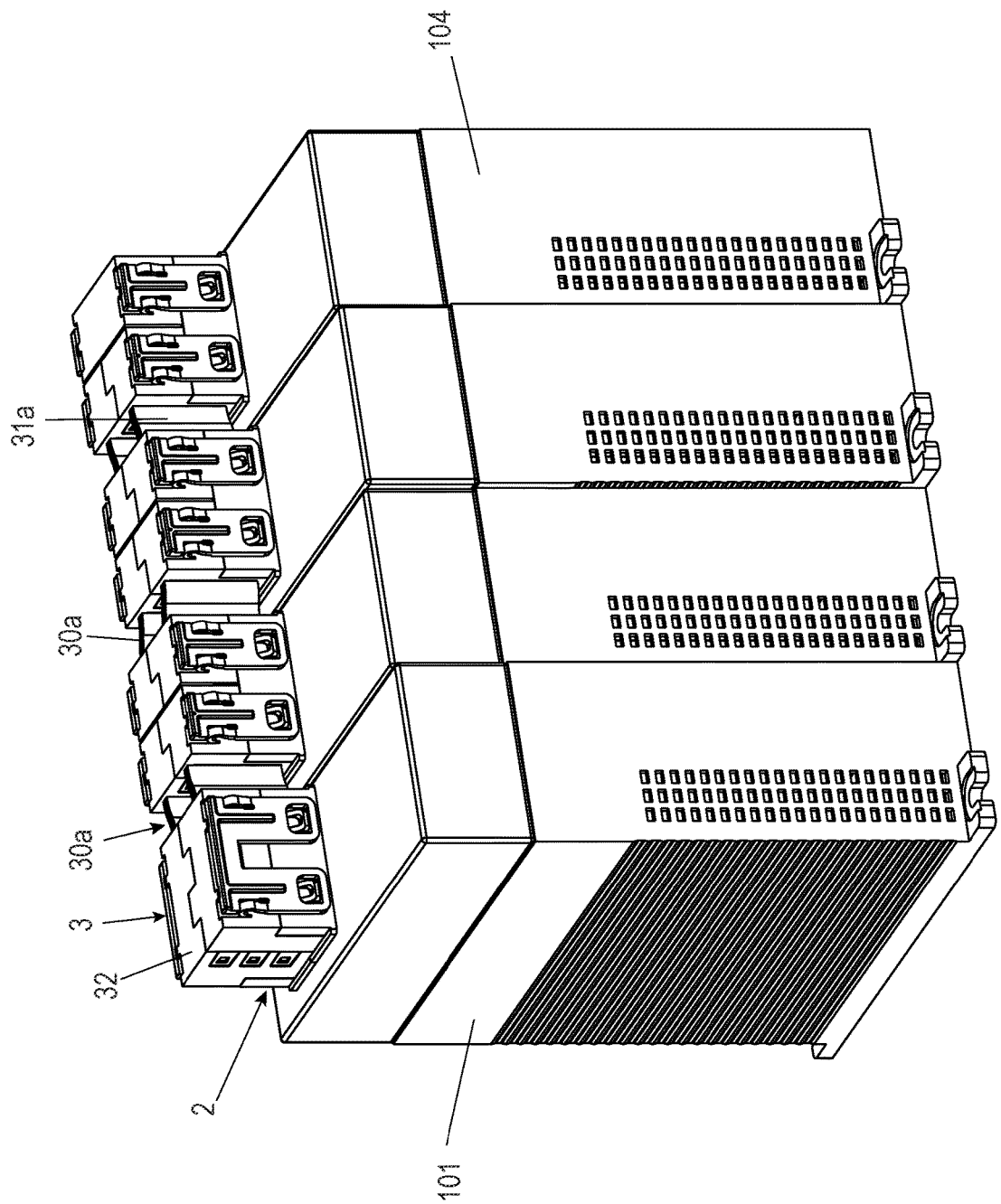

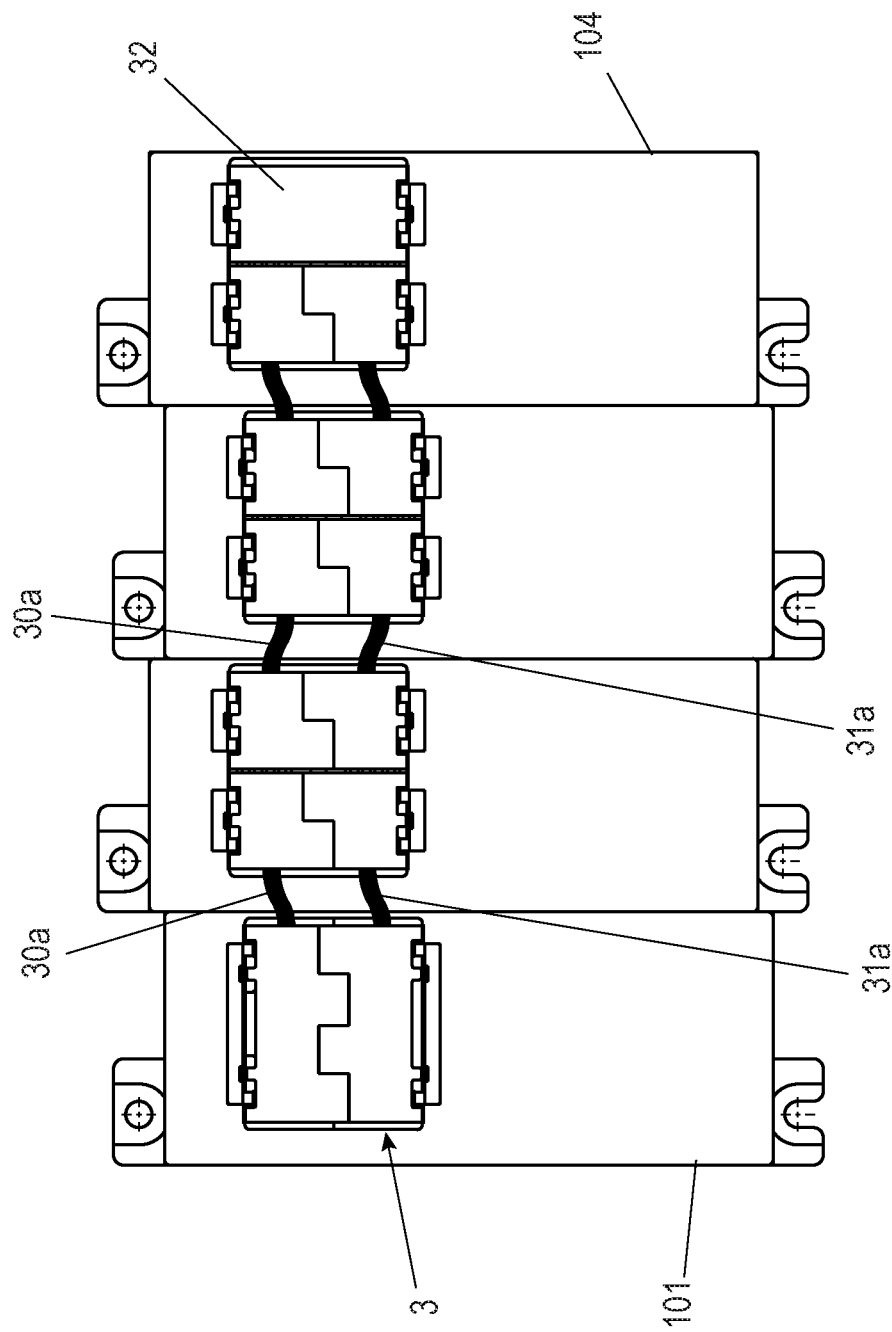

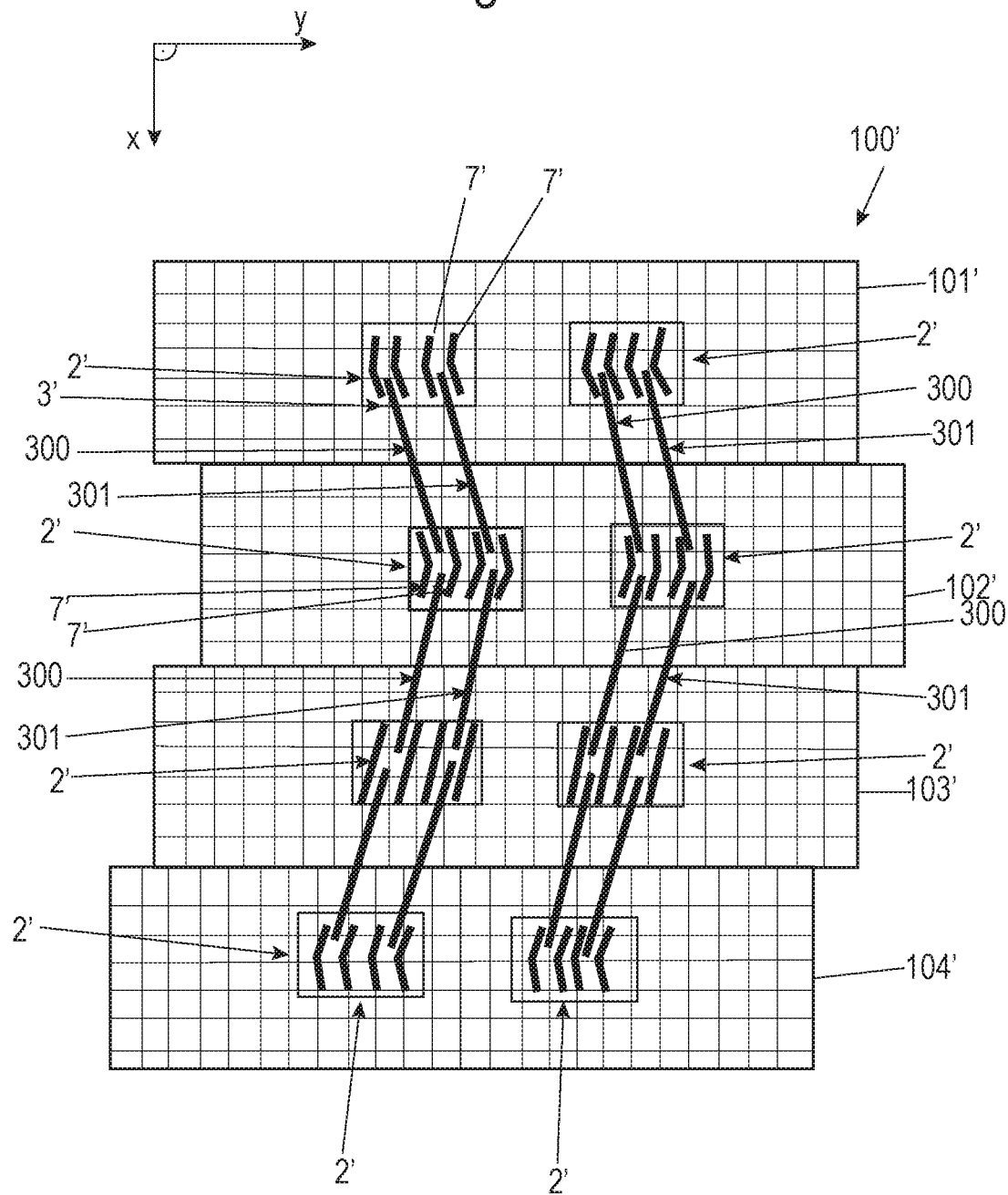

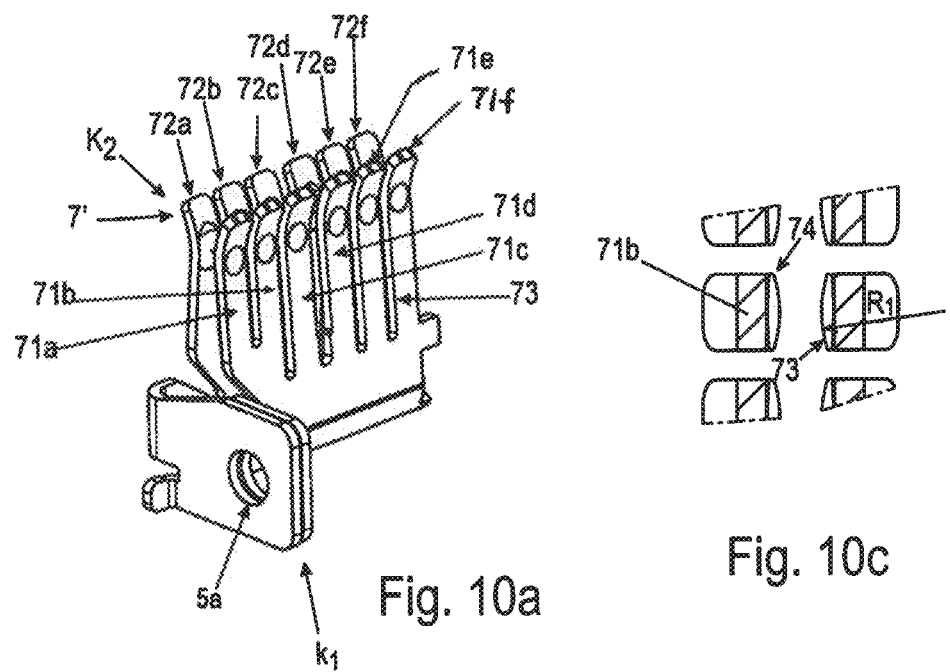
Fig. 10a
Fig. 10c
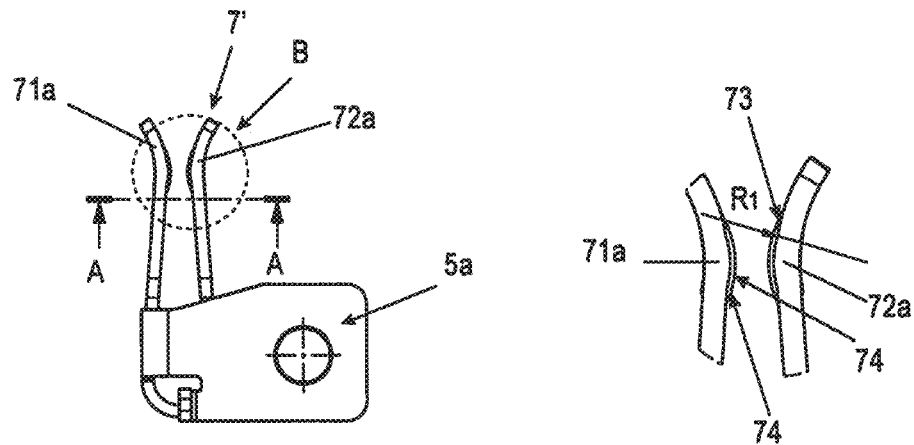
Fig. 10b
Fig. 10d

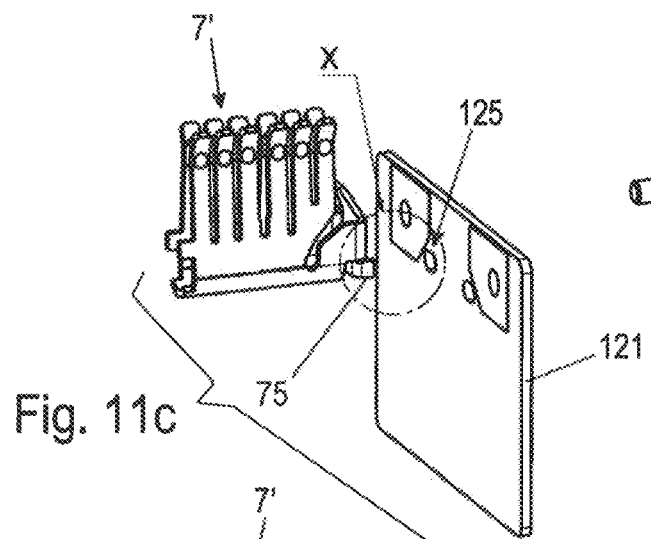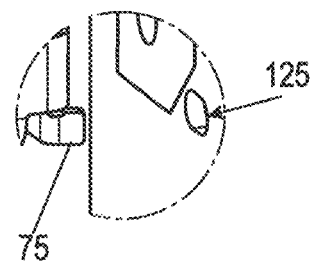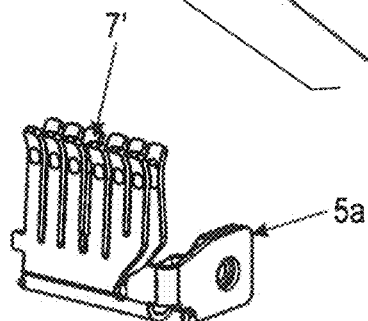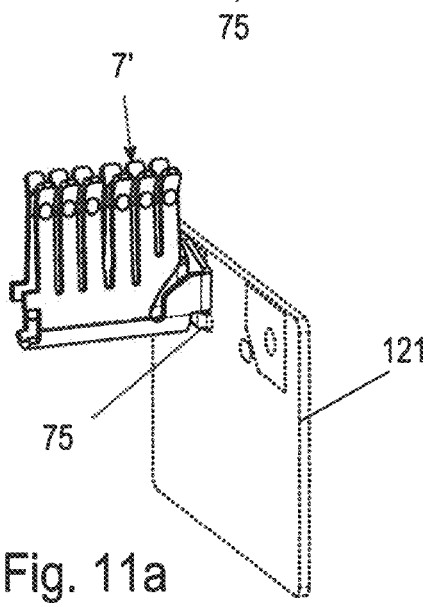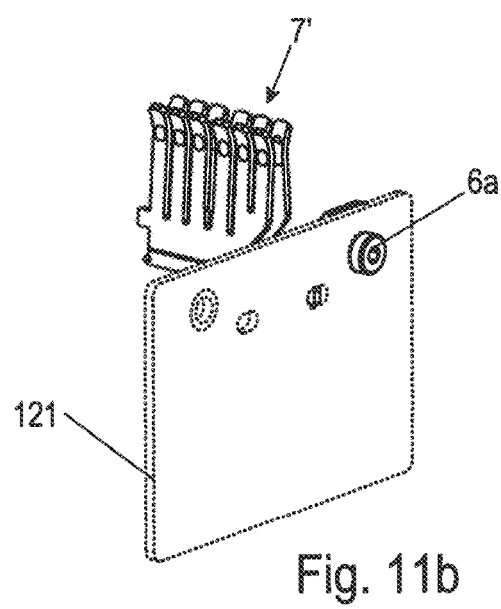

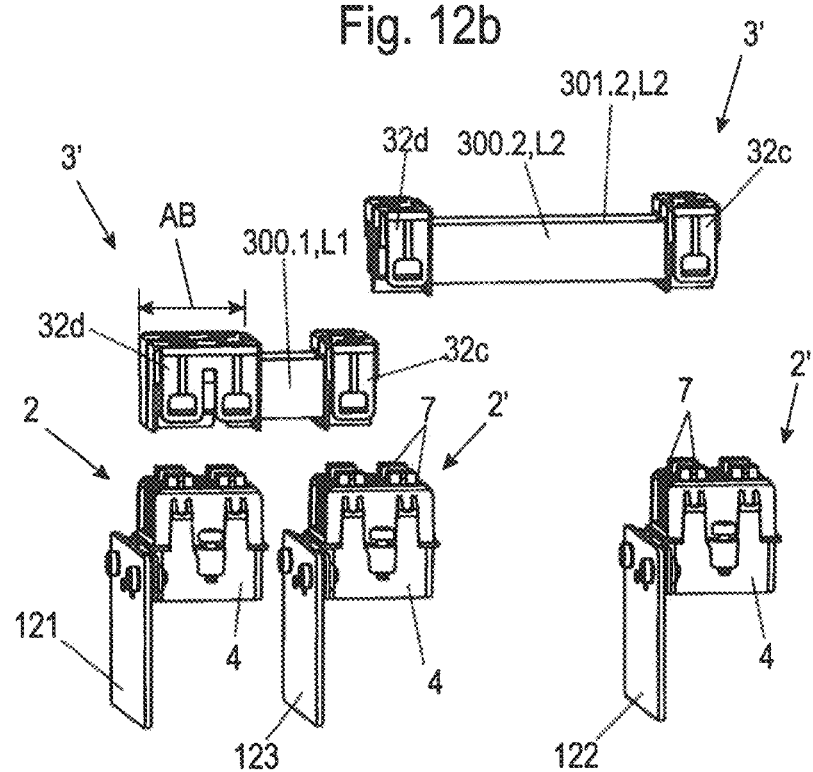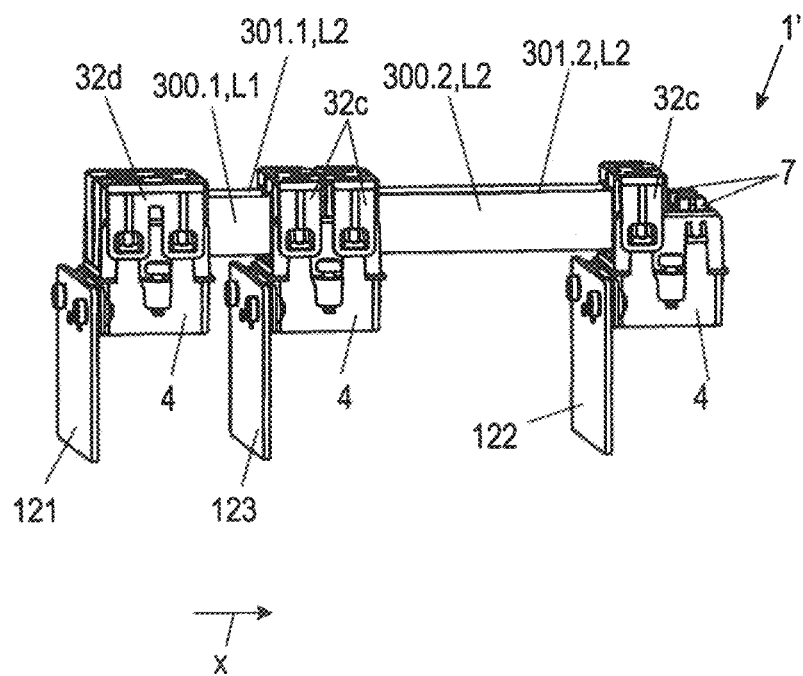

CONTACT AND BUSBAR ASSEMBLY, ELECTRONICS HOUSING ASSEMBLY HAVING SUCH A CONTACT AND BUSBAR ASSEMBLY, AND METHOD FOR REMOVING AN ELECTRONICS HOUSING FROM SUCH AN ELECTRONICS HOUSING ASSEMBLY

This application claims priority to German patent application No. 2018100964.8 filed Feb. 21, 2018 and German patent application No. 102019101859.5 filed Jan. 25, 2019. The entire contents of these applications are incorporated herein by reference.

BACKGROUND OF THE INVENTION

The present invention relates to a contact and busbar assembly, to an electronics housing assembly including such a contact and busbar assembly, and to a method for removing an electronics housing from such an electronics housing assembly.

BRIEF DESCRIPTION OF THE PRIOR ART

Generic contact and busbar assemblies are known per se from the prior art in greatly varying configurations, but generally have a relatively complicated structure which makes them relative expensive to manufacture.

DE 10 2017 116 342 A1 and DE 20 2013 103 444 U1 and also US 2012/0264317 A1 disclose various contact and busbar assemblies according to the prior art.

SUMMARY OF THE INVENTION

Against this background, it is the object of the present invention to provide a contact and busbar assembly which is relatively simply constructed from a design aspect and is thus cost-effective but nonetheless functionally reliable, and also an electronics housing assembly made of multiple electronics housings arranged against one another in an array having such a contact and busbar assembly, which can be easily and flexibly handled.

For this purpose, a contact and busbar assembly for forming a bus system on electronics housings arranged in an array is provided. The electronics housings each accommodate one electronics assembly, for example, a circuit board. The contact and busbar assembly is externally guided.

The contact and busbar assembly includes multiple bus plugs each having first connecting contacts for electrically contacting electronics assemblies, and at least one second connecting contact designed as a socket contact for electrically contacting power rail strips. Multiple power rail strips are provided for electrically connecting the bus plugs, in particular the second connecting contacts, of adjacent electronics housings. The power rail strips form the bus lines of the bus system. They can be formed as partially or completely flexible or rigid. The bus plugs are used as a connection for the current or voltage of a bus line.

The contact and busbar assembly includes at least one first power rail strip for electrically connecting the bus plugs of two electronics housings adjoining one another and at least one second power rail strip of greater length for electrically connecting two electronics housings spaced apart from one another.

Electronics housings which are arranged in front of or behind an electronics housing an array direction are referred to as adjacent to one another. In this case, an electronics housing adjacent to another electronics housing does not have to adjoin directly thereon, but rather they can be spaced apart. Electronics housings are spaced apart if a spatial mounting distance exists between them, even if one or more other electronics housings are arranged between the electronics housings spaced apart from one another.

The second power rail strips of greater length are provided for bridging the mounting distance. The electronics housings are thus not required to have a bus plug as a tap or connection for every bus line of the bus system, if the current conducted on the bus line or the voltage applied to the bus line is not required for the electronics assembly arranged in the electronics housing. Accordingly, the longer power rail strips result in a net savings of bus plugs. Not only are the costs for the contact and busbar arrangement thus reduced, but less effort is required for mounting the contact and busbar assembly.

For this purpose, the length of the second power rail strips is one or more electronics housing widths longer than the length of the first power rail strips. With a uniform electronics housing width of all electronics housings of the electronics housing assembly, the second power rail strip, which is longer by precisely one electronics housing width, then bridges precisely one electronics housing. If the second power rail strip is multiple electronics housing widths longer, it then bridges the number of electronics housings by the multiple of the width of which it is longer than the first power rail strip.

In a preferred embodiment, the electronics housings of the electronics housing assembly have a width which is a multiple of smallest electronics housing width. To bridge an electronic housing wider than the smallest electronics housing width, a power rail strip is required which is longer by the corresponding multiple of the smallest electronics housing width than the first power rail strip.

However, the electronics housings can also have very different electronics housing widths. In this alternate embodiment, the length of the second power rail strip is adapted to the width of the one or more electronics housings to be bridged.

The power rail strips preferably have a connecting portion on each of the opposing ends thereof, the connecting length of which corresponds to approximately half of the connecting width of the second connecting contact of the bus plug. Two power rail strips arrayed against one another in the array direction can then be plugged in succession into the same second connecting contact. On a feed housing of an electronics housing assembly, this enables a T-type energy distribution.

To be able to deliver more power into a feed power rail strip at a feed housing of the electronics housing assembly, the contact and busbar assembly for the feed housing includes at least one feed power rail strip having an extended connecting part. The connecting length of this extended connecting part corresponds to the connecting width of the second connecting contact of the bus plug. The length of the feed power rail strip is thus longer by half of the connecting width than the power rail strip used for the T-type energy distribution on the feed housing. The connecting part of the feed power rail strip extends over the entire connecting width of the second connecting contact. This allows more power to be fed into the feed power rail strip at the second connecting contact.

According to a further object of the invention, an electronics housing assembly has multiple electronics housings arranged against one another in an array direction and a contact and busbar assembly. The contact and busbar assembly forms a bus system which connects the electronics assemblies or circuit boards arranged in the electronics housings to one another via supply lines and/or data lines. Each of the electronics housings preferably has at least one bus plug which electrically connects the electronics assembly of the respective electronics housing to a supply line or to a data line of the bus system. In this case, the supply lines or data lines are formed by the power rail strips.

The electronics housings are preferably designed as rack housings and preferably have a full or partially open connecting side. The contact and busbar assembly is arranged on the connecting side.

The use of the contact and busbar assembly for the electronics housing assembly has the advantage that the electronics housings do not require a bus plug for every supply line of the bus system and for every data line of the bus system, particularly if the electronics assembly arranged in the electronics housing does not require a bus line at all. The extended power rail strips then provide bridging of one or more electronics housings to the next electronics housing where the electronics assembly uses the bus line.

This object is achieved by a method for removing or replacing a removed electronics housing arranged between two adjacent electronics housings of such an electronics housing assembly. In this case, the bus plugs of the adjacent electronics housings are electrically conductively connected by a power rail strip to the bus plug of the removed electronics housing.

More particularly, the power rail strip connecting the removed electronics housing to the adjacent electronics housings is removed. Then, a selected electronics housing is from the electronics housing assembly. Lastly, the bus plugs of the adjacent electronics housings are connected to one another by a second longer power rail strip.

The use of the longer second power rail strip enables bridging of the removed electronics housing of the electronics housing assembly such as during inspection of the removed electronics housing. A second power rail strip is preferably used for this purpose. The length of the second power rail strip is computed from the total of the lengths of the removed power rail strips plus the electronics housing width of the removed electronics housing. The remaining electronics housings of the electronics housing assembly can thus be operated during the inspection of the removed electronics housing.

The removed electronics housing can also be replaced by a replacement electronics housing which has the same or a narrower electronics housing width as the removed electronics housing or is narrower and which does not require the bus plug.

The use of second longer power rail strips enables the construction of a simpler and very cost-effective contact and busbar assembly on electronics housings. Moreover, it enables operation of an electronics housing assembly during inspection of parts of the electronics housing assembly including inspection of the removed electronics housing.

BRIEF DESCRIPTION OF THE FIGURES

The invention will be described in greater detail below with reference to the accompanying drawings in which:

FIG. 6a is an exploded perspective view of a power rail strip assembly of the contact and busbar assembly of FIG. 3;

FIG. 6b is an exploded perspective view of the contact assembly and housing of the contact and busbar assembly of FIG. 4;

FIG. 7 is a perspective view of the electronics housing assembly of FIG. 1 with a contact and busbar assembly according to the invention;

FIG. 8 is a top view of the electronics housing assembly of FIG. 7;

FIG. 9 is a top schematic view of electronics housing assembly according to the invention having a contact and busbar assembly according to an alternate embodiment;

FIG. 10a is a perspective view of a bus plug according to the invention;

FIG. 10b is a side view of the bus plug shown in FIG. 10a;

FIG. 10c is a partial sectional view of a portion of the bus plug taken along line A-A in FIG. 10b;

FIG. 10d is an enlarged illustration of the detail B of FIG. 10b;

FIGS. 11a and 11b are front and rear perspective views, respectively of a bus plug according to an alternate embodiment;

FIG. 11c an exploded view of FIG. 11a;

FIG. 11d is an enlarged illustration of detail X of FIG. 11c;

FIG. 11e is a perspective view of an alternate embodiment of the bus plug of FIG. 11c;

FIG. 12a is a perspective view of a contact and busbar assembly according to a further embodiment of the invention;

FIG. 12b is an exploded view of FIG. 12a;

DETAILED DESCRIPTION

Figure 1:
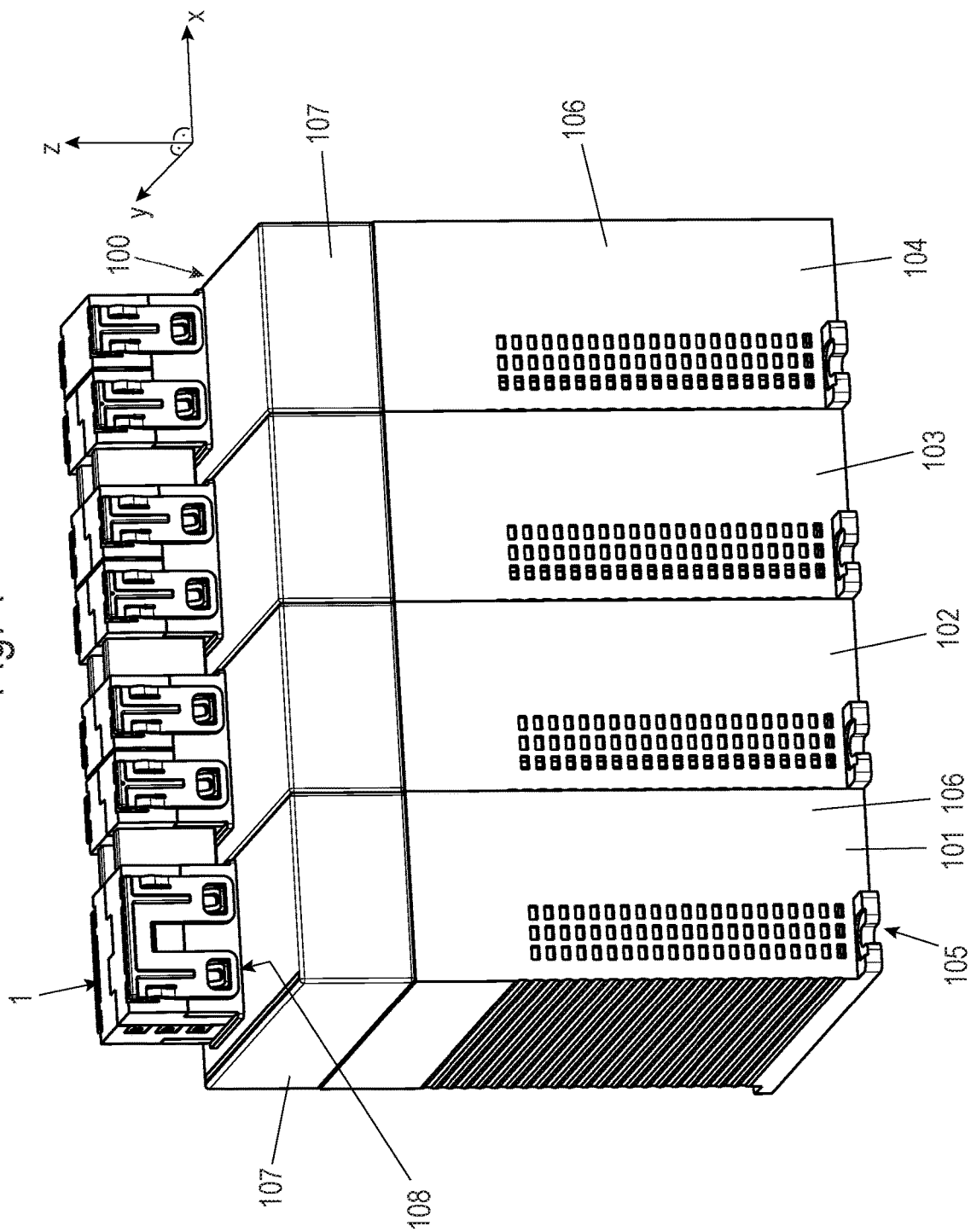
FIG. 1 is a perspective view of an electronics housing assembly having a contact and busbar assembly according to the invention.

FIG. 1 shows an electronics housing assembly 100. The electronics housing assembly 100 has a plurality of electronics housings 101, 102, 103, 104 which can be arranged directly adjacent to one another or arranged at least indirectly adjacent to one another in an array direction X. Four of the electronics housings 101, 102, 103, 104 arrayed adjacent to one another are shown, although any number may be provided.

The electronics housings 101, 102, 103, 104 can be designed as rack housings, surface-mounted housings, or screw-on housings as shown in FIG. 1 which are fastenable via fasteners 105 on a base (not shown) using screws for examples.

Figure 2:
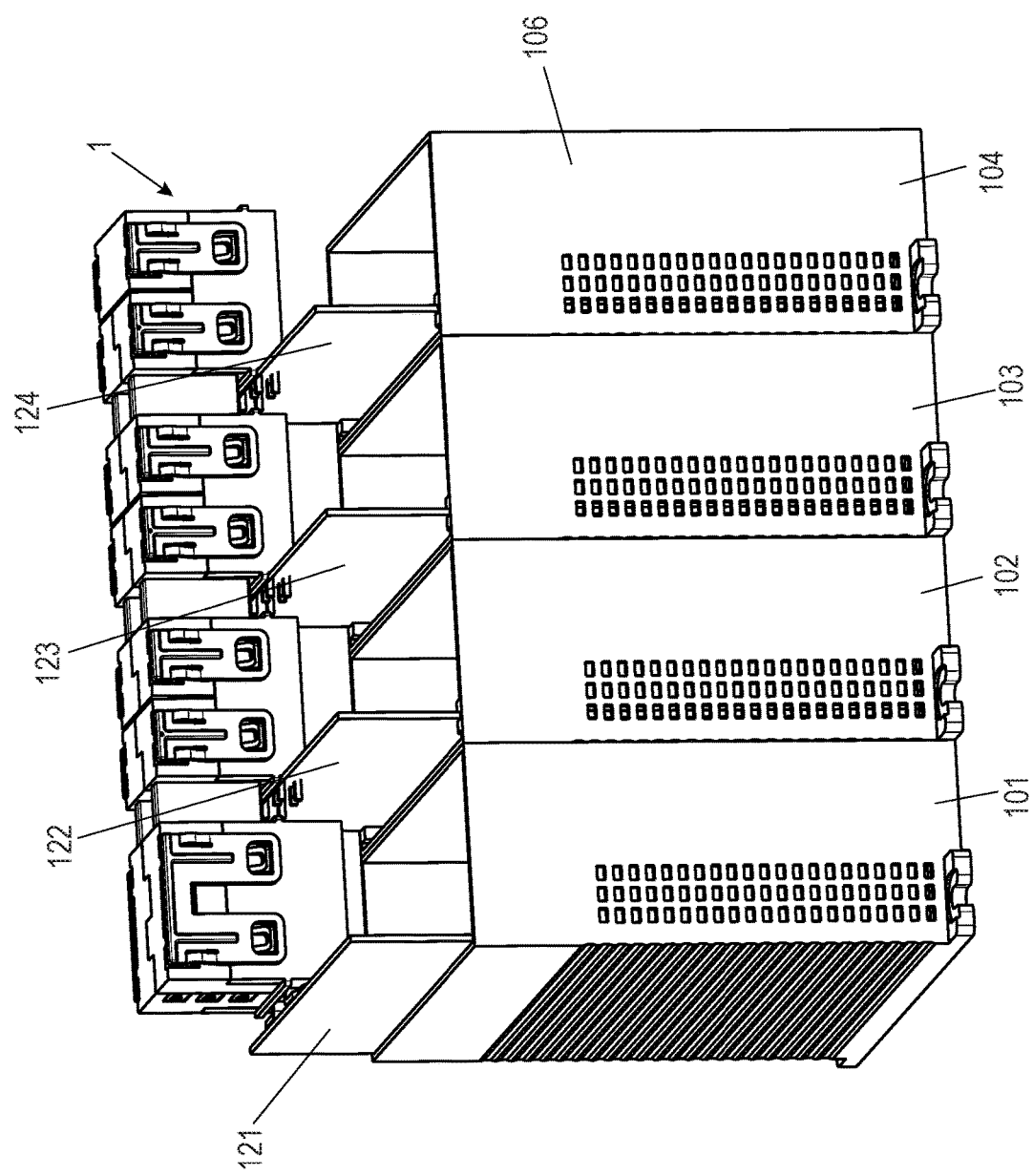
FIG. 2 is a perspective view of the assembly of FIG. 1 without a housing cover.

The electronics housings 101, 102, 103, 104 each have a main housing 106 and a cover 107 which covers an open narrow side of the main housing 106 as also shown in FIG. 2. In this case, the covers 107 have a window 108 or a peripheral opening.

At least one circuit board 121, 122, 123, 124 is inserted into each of the electronics housings. The circuit boards 121, 122, 123, 124 are aligned perpendicular to the array direction X and/or parallel to a Y-Z plane so that they are arranged essentially parallel to the electronics housings 1. The axes X, Y, and Z form the three axes of a Cartesian coordinate system.

A contact and busbar assembly 1 is formed on the circuit boards for forming a single or multiple bus system on the electronics housings. In this regard and with respect to the structure of the contact and busbar assembly, reference is also made in particular to FIGS. 3-6b.

Figure 3:
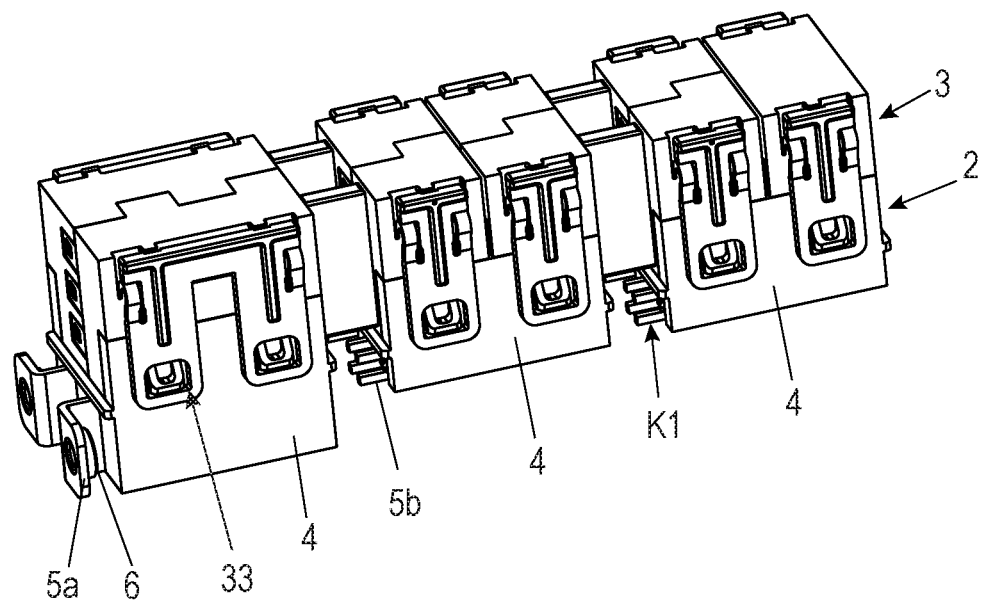
FIG. 3 is a perspective view of a section of the contact and busbar assembly of FIGS. 1 and 2.
Figure 4:
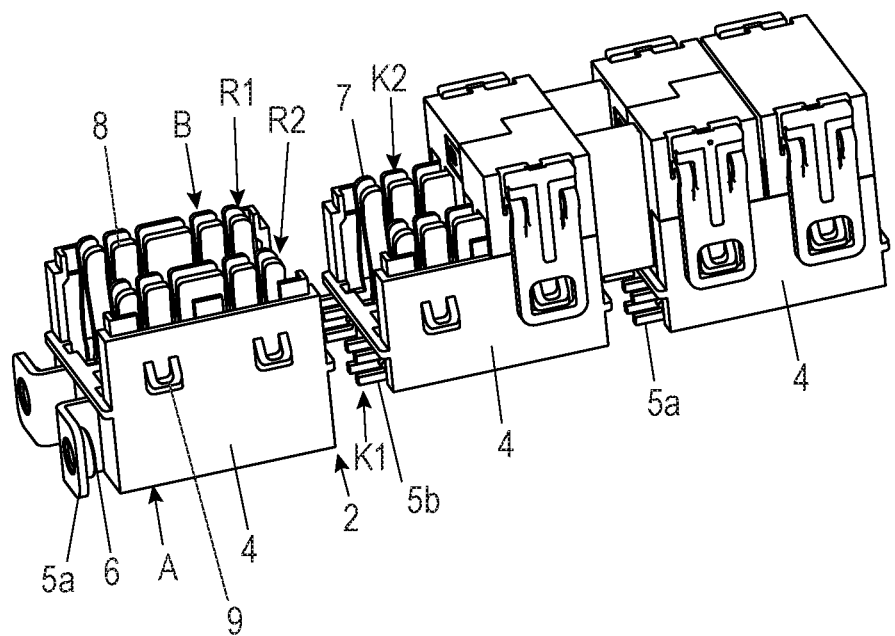
FIG. 4 is a perspective view similar to FIG. 3 wherein a portion of a busbar assembly has been removed.

The contact and busbar assembly 1 has a bus plug 2 on each of the electronics housings as shown in FIG. 3.

The contact and busbar assembly 1 has one or more power rail assemblies 3, which conductively connect the bus plugs 2 of adjacent electronics housings to one another.

At least one bus plug 2 is positioned on each circuit board. In the illustrated embodiment, one bus plug 2 is provided per electronics housing. This bus plug contacts the respective circuit board 121 to 124 in the respective electronics housing.

The bus plugs 2 can be formed as identical or substantially identical structures. A preferred structure of such a bus plug 2 will be described in greater detail hereafter. The structure can thus be transferred to all of the four bus plugs 1 in the illustrated embodiment except for the differing design of the contacts K1. However, all contacts K1 can also be designed to be identical such as, for example, as screw terminals or solder terminals.

As shown in FIGS. 3-6, each bus plug 2 includes a housing 4 having a first connecting side A having first connecting contacts K1 and a second connecting side B having second connecting contacts K2. In comparison to a bus plug disclosed in US patent application publication No. 2012/0264317 A1, an intermediate adapter plug and thus a further contact zone between the respective circuit board and the bus plug is omitted.

The first connecting contacts K1 on the first connecting side A are formed on a first of the bus plugs as a screw terminal 5a having a screw 6a and nut 6. The screw terminal 5a is formed as a tab having a passage opening and contacts the circuit board. A screw passes through the passage opening. In this way, energy or current is to be fed via this screw terminal 5a from the circuit board 121 of the first electronics housing 101 directly via the bus plug 1 into the contact and busbar arrangement 1 and into the arrayed circuit boards of the arrayed electronics housings 102, 103, 104.

Accordingly, the socket contacts are designed in such a way that the first connecting contacts K1 are also directly formed on the side thereof facing away from the actual socket contacts or on the side thereof facing away from the second connecting contacts K2.

The first connecting contacts K1 of the remaining bus plugs 1 on the first connecting side A are preferably in the form of solder pins 5b, which electrically conductively contact the respective circuit board. The solder pins 5b preferably extend parallel to or in the array direction X. The solder pins can be formed as ends of the socket contacts. Alternatively, the solder pins 5b are configured for contact only from one side or end. The pins can salso be provided on the respective circuit board and then connected with a power rail strip of the bus plug via a solder surface or connection. These solder surfaces or the like then form the first connecting contacts K1.

The socket contacts are also accordingly designed in such a way that the first connecting contacts K1 are also directly formed on the side thereof facing away from the actual socket contacts or on the side thereof facing away from the second connecting contacts K2.

The contact zone, in which the first connecting contacts K1 contact the actual circuit board lies inside the electronics housing 1. The second connecting contacts K2 on the opposing side of the housing 4 of the bus plugs 1, which are in one piece here, are preferably formed as socket contacts 7 formed as single or multiple contacts, which protrude from the housing 4. In this case, these socket contacts 7 each have spring legs spaced apart from one another and opposing one another, between each of which a slotted contact zone 8 is formed. The respective slotted contact zone 8 is preferably aligned parallel to the array direction X.

The second connecting contacts K2 preferably protrude outwardly from the connecting side A of the housing beyond the electronics housing. The first and the second connecting contacts K1 and K2 or 5a or 5b and 7, respectively, can be conductively connected to one another, for example, via one or more busbar pieces or the like (not shown).

One of the bus plugs 2, each of which has a plurality of the first connecting contacts K1 and two of the second connecting contacts K2 or socket contacts 7, respectively, is provided for each electronics housing.

The number of elements and components described herein are to be considered only as advantageous examples. Other numbers of elements and components can also be provided. The contacts are preferably distributed in such a way that two potentials can be connected or distributed further for each bus plug 2.

The socket contacts 7 of the bus plugs 2 are arranged in two rows R1, R2 parallel to the array direction X, wherein the slotted contact zones 8 are each aligned parallel to the array direction X.

In this case, the first connecting contacts K1 are used for contacting the respective circuit board with a power and/or data bus and the second connecting contacts K2 are used for contacting a power rail assembly 3 for relaying a respective potential of a power and/or data bus from circuit board 121 to the circuit board and/or from one of the electronics housings arrayed adjacent to one another to another of the electronics housing. The power rail assembly 3 is therefore required to supply power in a simple and efficient manner.

Figure 5:
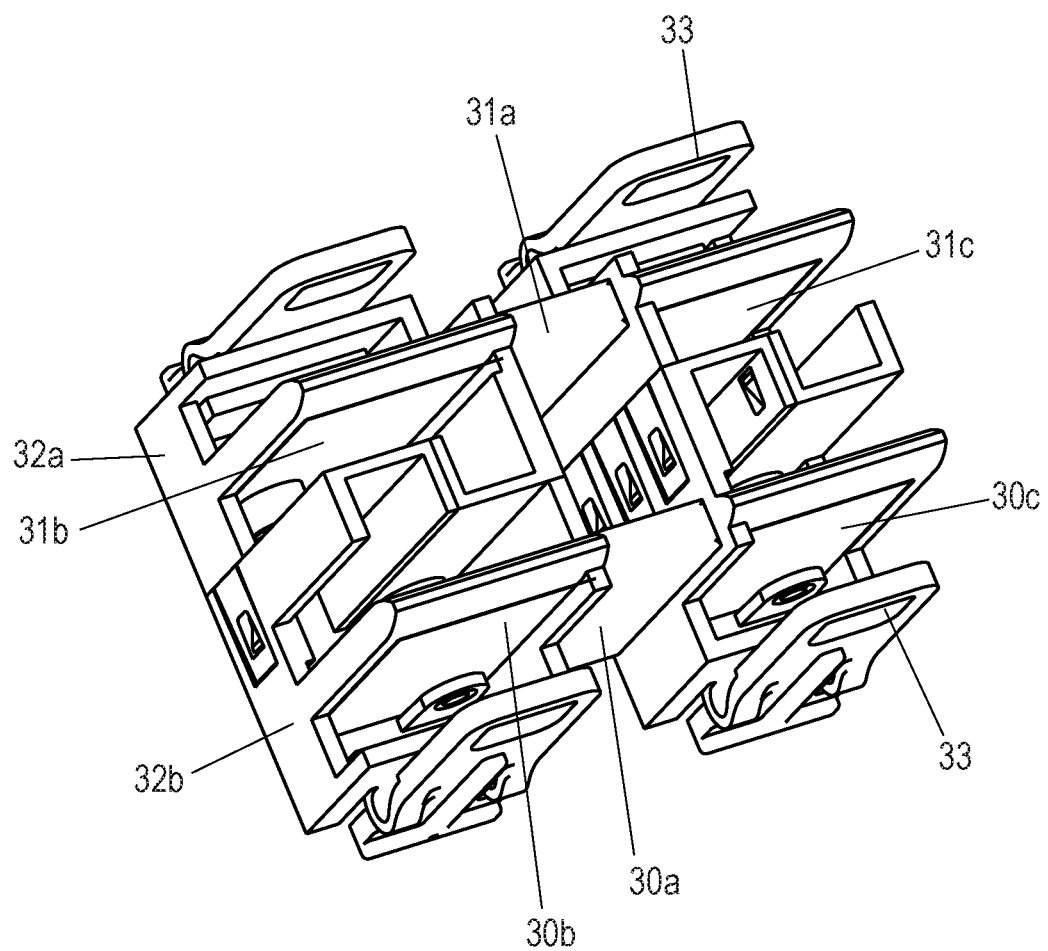
FIG. 5 is a top perspective view of a busbar assembly.

The preferred power rail assembly 3 can be formed from one or more power rail strips 30, 31 and shells or covers 32 as shown in FIGS. 5 and 6. However, the power rails can be formed continuously over all of the bus plugs or can connect individual ones of these bus plugs 2. The power rails are inserted into the bus plugs 2 or the socket contacts 7 thereof like contact blades in order to conductively connect two or more of the bus plugs 2.

The covers 32 are preferably provided with catch devices 33 for locking onto corresponding counter catch devices 9 of the housing 4 of the bus plugs 2.

The power rail strips 30, 31 are formed of material having good electrical conductivity and particularly a metal such as a copper alloy.

The power rail strips 30, 31 are reversibly flexibly deformable at least sectionally at least perpendicularly to the main extension direction of the power rail strips 30, 31.

The required flexible design can be achieved in that the respective power rail strips 30, 31 are formed in sections 30a, 31a from a type of single-layer or multilayer braid of metal wires.

The flexible design can alternatively also be achieved by forming the power rail strips 30, 31, at least in a section 30a, 31a, from multiple thin sheet metal strips layered in parallel like slats.

A copper alloy is preferably used as the metal for manufacturing the power rail strips 30a, 30b.

Nonflexible sections 30b, 30c or 31b, 31c, respectively, adjoin each of the flexible sections 30a, 31a.

In this way, a power rail strip 30 or 31 which is at least sectionally flexible perpendicular to the array direction in any case is formed.

The nonflexible sections 30b, 30c or 31b, 31c are preferably fixed inside a respective corresponding cover 32. The respective flexible sections 30b, 31b or 30c, 31c extend in each case between two adjacent bus plugs 2, and the covers 32 are each only provided in the region of the bus plugs 2.

The power rail strips are preferably fixed in the nonflexible sections 30b, 30c or 31b, 31c on the covers 32, for example, via pins 34 on the covers 32 that engage in the receptacle holes 35 of the sections 30b, 31b; 31b, 31c as shown in FIG. 6.

The power rail strips 30, 31 extend over a plurality of the covers 32 or bus plugs 2—preferably two—and thus connect at least two or more of the bus plugs 2 to one another as shown in FIGS. 5 and 6a. In the region of the socket contacts 7, the power rail strips can then be used for the power supply to the respective circuit board or also for the power to the closest busbar section 30 to 30', etc. It is then necessary and advantageous that the socket contacts 7 of adjacent electronics housings conductively connect each of the two power rail strips 30, 30' or 31, 31' adjacent in the array direction to one another as shown in FIG. 6a.

In the first electronics housing 101—which can also be referred to as a feed module—the two power rail strips 30, 31' can be continuously formed over the entire socket contacts 7 and can extend up to the adjacent electronics housing 102 having a bus plug 2 and can contact the two socket contacts 7 therein.

According to an alternate embodiment, however, the power rail strips 30, 31 can also be designed to be flexible over the entire length thereof.

It is particularly advantageous that due to the sectionally or continuously flexible design of the power rail strip or strips 30, 31 in a direction Y perpendicular to the array direction X, tolerances in the structure can be compensated for in a simple manner. These tolerances arise from the arrangement of the electronics housings on a mounting base and from tolerances of the components of the assembly. Preferably, tolerances can also be compensated for in the array direction X and/or in the Z direction if a wire braid is used for the flexible regions.

It is also possible to provide the power rail strips between the bus plugs 2 arrayed against one another with insulation which also has limited flexibility.

The housings and covers 32 of the bus plugs 2 can be formed in one or multiple pieces and in particular can be assembled from multiple housing/cover sections 32a, 32b. They can interlock via steps or the like. The housing/cover sections 32a, 32b can also be lockable on one another as shown in FIG. 6a.

The pins 34 can also be used to center the housing/cover halves 32a, 32b on openings or the like or to connect the halves.

Higher currents and/or a higher level of energy can also be easily transmitted using one or more of the power rail strips 30, 31.

In this manner, it is possible to directly conductively connect the bus plugs 2 over two or more of the electronics housings. The covers 32 including the pre-mounted power rail strips 30, 31 are plugged onto the bus plugs and plugged therein for this purpose. Tolerance variations occurring in this case are compensated for by the flexible sections 30a, 31a in the region between the covers 32 as shown in FIGS. 7 and 8.

FIG. 9 is a schematic illustration of a further embodiment of an electronics housing assembly 100'. This electronics housing 100' also has a plurality of electronics housings which can be arrayed directly against one another or are arrayed at least indirectly adjacent to one another in an array direction X. Four of the electronics housings 101', 102', 103', 104' arranged adjacent to one another are shown by way of example. They are arranged against one another in the array direction X. In the Y direction perpendicular to the array direction X, the electronics housings are slightly offset in relation to one another because of tolerances. This is also illustrated in FIG. 9.

The electronics housing assemblies 101' to 104' can be constructed like the electronics housing assembly of FIGS. 1 to 8. Reference is thus made to the above description of FIGS. 1 to 8, which also applies to FIGS. 9-11 except for the differences to be described below.

The contact and busbar assembly 1 again has one or more power rail assemblies 3', which conductively connect the bus plugs 2' of adjacent electronics housings to one another. In this embodiment of the contact and busbar assembly, the power rail strips 300, 301 are rigid. This means they do not have any especially flexibly designed sections. The power rail strips 300, 301 rather have metal rail strips cut to length from a material having good electrical conductivity, in particular a metal or a metal alloy. Sections of the strips are coated using plastic or other insulating materials and/or are provided with covers (not shown as in FIGS. 1 to 8).

To connect the bus plugs 2 to one another by the power rail strips 300, 301 in the array direction of adjacent electronics housings 101'-104', the tolerance compensation of the offset perpendicular to the array direction X is not performed via the power rail strips 300, 301', but rather via the bus plugs 2'. The socket contacts 7' of the bus plugs 2', in which each two adjoining power rail strips 300, 301 are pluggable in order to contact the socket contacts 7' are designed in such a way that power rail strips 30', 31' are also pluggable therein in a nonlinear direction and/or inclined to the array direction.

This is achieved in various ways. According to the embodiment illustrated in FIGS. 9, 10, and 11, the socket contacts 7' each have opposing spring legs spaced apart from one another, between which a slotted contact zone 8' is formed. The respective slotted contact zone 8' is preferably aligned parallel to the array direction X.

In addition, the opposing spring legs of the socket contacts 7' are divided in the array direction X into multiple contact portions 71a, b, c, d, e, f and 72a, b, c, d, e, f, which are each separated in the array direction X by notches 73 as shown in FIG. 10a. This results in a quasi-flexible deformable socket contact 7.

The contact portions 71a, b, c, d, e, f and 72a, b, c, d, e, f are preferably opposite to one another. A division into a number of contact portions 71a, b, c, d, e, f and 72a, b, c, d, e, f other than that shown is also possible. Each two of the contact portions 71a, b, c, d, e, f and 72a, b, c, d, e, f can cooperate to form, a contact socket. The slotted contact zone 8' is formed between the two rows of contact portions 71a, b, c, d, e, f and 72a, b, e., d, e, f.

Half of the contact portions, i.e. portions 71a, b, c and 72a, b, c) are used for contacting the end of one respective first power rail strip 300, 301 from an adjacent socket contact 7' and another half of the contact portions 71d, e, f and 72d, e, f are preferably used for contacting power rail strip 300, 301 adjoining a further socket contact 7' on the opposing side. In a first or last electronics housing of an electronics housing assembly 100', all contact portions 71a, b, c, d, e, f and 72a, b, c, d, e, f of the respective socket contact 7 can be contacted as a whole by each of the ends of a power rail strip 30, 31', for example, to be able to feed a higher power in via more contact points.

If the power rail strips 300, 301 are arranged obliquely in relation to the array direction X because of tolerances, in order to be able to connect adjacent bus plugs 2 of adjacent electronics housings, this design offers the advantage that it is possible to deflect the respective contact portions 71a, b, c, d, e, f and 72a, b, c, d, e, f differently, in particular by different amounts. A good electrical contact is nonetheless ensured in this case. Such a situation is schematically shown in FIG. 9. In this case, bus plugs 2 having socket contacts as shown in FIGS. 10a-10d and 11a-11e can be used.

The contact portions 71a, b, c, d, e, f and 72a, b, c, d, c, f are preferably rounded with a radius R1 as shown in FIG. 10d in the sides facing each other. For this purpose, corresponding embossments can be introduced into the contact portions 71a, b, c, d, e, f and 72a, b, c, d, e, f, so that convex contact regions 74 are formed toward the respective contact side as shown in FIGS. 10a-10d. In this way, power rail strips 300, 301 which are aligned obliquely in relation to the array direction because of tolerances are in contact since the power rail strips 300, 301 can be arranged tangentially or optimized to the respective contact regions 74 as a result of an inclined position.

One or more of the first connecting contacts K1 on the first connecting side A are formed as a screw terminal 5a with or without a nut as shown in FIGS. 11a-11e. This screw terminal 5a receives a screw 6a for connection with a circuit board 121. A projection 75 is provided on the respective socket contact 7' which engages in a formfitting manner with a corresponding opening such as a passage hole 125' of the circuit board to be contacted. In this way, an additional twist lock or other type of alignment aid is provided between the respective socket contact 7' and the respective circuit board 121 so that the respective socket contact 7' is supported in a formfitting manner via a lug on the circuit board 121.

FIGS. 12a and 12b are perspective and exploded views, respectively, of a contact and busbar assembly 1' according to the invention. The contact and busbar assembly 1' has multiple bus plugs 2' having first connecting contacts K1, which are each provided for electrically contacting electronics assemblies such as circuit boards 121, 122, and 123, and having second connecting contacts K2 which are designed as socket contacts 7 for electrically contacting power rail strips 300, 301. Furthermore the assembly 1' has multiple power rail strips 300, 301, each for electrically connecting the second connecting contacts K2 of the bus plugs 2 of adjacent electronics housings. The power rail strips 300, 301 are preferably rigid. However, the invention is also applicable to power rail strips which are formed at least partially or entirely flexible.

Two bus plugs 2' arranged adjacent to one another in the array direction X are provided in one electrically insulating housing 4. Two power rail strips 300, 301 can thus be arranged parallel to one another in each bus plug 2'. Each of the power rail strips 300, 301 represents one bus line of the bus system.

The second connecting contacts K2 of both bus plugs 2' are each connected to one circuit board 121, 122, 123 independently of one another. The current and voltage of both bus lines are thus each available independently of one another at each circuit board 121, 122, 123.

The power rail strips have connecting portions 36, 36' (shown in FIG. 6a) which are arranged in electrically insulating covers 32c, 32d. To plug the power rail strips 300, 301 into a bus plug 2', the covers 32c, 32d are plugged onto the housing 4. At the same time, the connecting portions 36, 36' of the power rail strips 300, 301 which are arranged in the covers 32c, 32d are inserted into the socket contact 7 of one of the two bus plugs 2' arranged in the housing 4 to form an electrical contact. The covers 32c, 32d lock on the housing 4 at the same time.

Figure 13B:
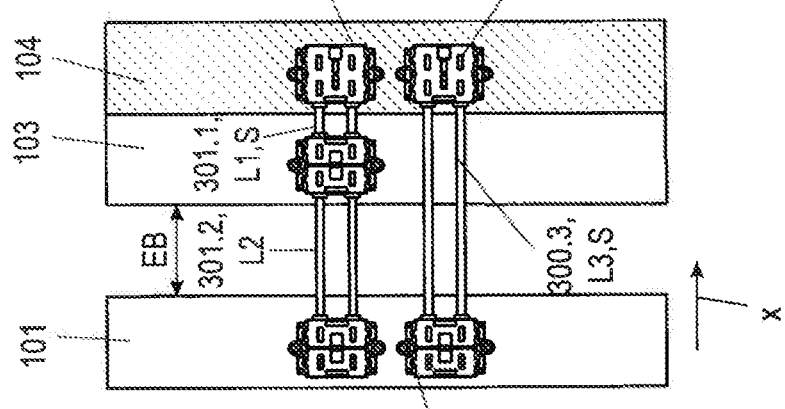
FIG. 13b is a plan view of the electronics assembly of FIG. 13a after removal of one of the electronics housings.
Figure 13A:
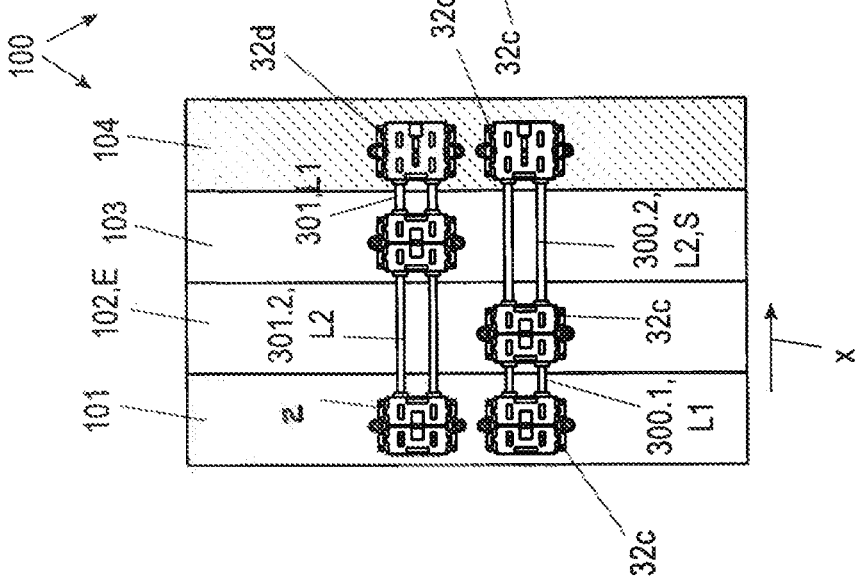
FIG. 13a is a plan view of an electronics housing assembly having a plurality of electronics housings arranged against one another in an array and a contact and busbar assembly according to a further embodiment of the invention.

The power rail strips 300, 301 have different lengths L1, L2. Specifically, the contact and busbar assembly 1' has a first power rail strip 300.1 of a shorter length L1 for electrically connecting the bus plugs 2' of two directly adjacent electronics housings 101, 102, 103, 104, 105 as shown in FIGS. 13a and 13b, and a second power rail strip 300.2 of greater length L2 for electrically connecting two electronics housings spaced apart from one another. The length of each power rail strip 300, 301 is indicated by a number appended after a comma or period in the reference sign.

The second power rail strips 300.2 of greater length are provided for bridging a mounting distance between two electronics housings. Every electronics housing thus does not require a bus plug 2' for every bus line if the electronics assembly arranged in the electronics housing does not require the current conducted therein or the voltage applied thereto. The use of longer second power rail strips 300.2 thus results in savings of bus plugs and reduces the mounting effort.

For this purpose, the length L2 of the second power rail strip 300.2 is longer than the length L1 of the first power rail strip 300.1 by one electronics housing width EB or a multiple thereof. With a uniform width EB of all electronics housings of the electronics housing assembly 100 or if the width EB of all electronics housings is a multiple of a smallest electronics housing width EB, using such a longer second power rail strip, at least one missing electronics housing can be bridged.

FIG. 12 also shows covers of the contact and busbar assembly 1, the connecting widths AB of which are different from one another. The covers 32c, 32d either have the connecting width AB of the second connecting contacts K2 or half of the connecting width AB of the second connecting contacts K2. In this case, the power rail strips 300, 301 completely penetrate the covers 32c, 32d. This enables a differing power feed and/or distribution in the electronics housing assembly 100.

FIG. 13a shows an electronics housing assembly 100 having multiple electronics housings 101-104 arranged against one another in the array direction X and a contact and busbar assembly 1' according to the invention. In FIG. 13b, the electronics housing assembly 100 is shown after removal of one of the electronics housings in this example the electronics housing 102. The electronics housing 102 is the removed electronics housing E.

It can be seen from FIGS. 13a and 13b that the contact and busbar assembly 1' has longer second power rail strips 300.2, 301.2 for removal of the removed electronics housing E. The longer second power rail strips 300.2, 301.2 bridge electronics housings which do not require the signal transmitted via the power rail strips 300.2, 301.2 or the current provided therein.

In order to remove the electronics housing E, for example, for the inspection of the electronics assembly arranged in the removed electronics housing from the electronics housing assembly 100, the power rail strips 300.1, 301.1, 300.2, 301.2 connecting the removed electronics housing E adjacent electronics housings are removed. The removed electronics housing E of the electronics housing assembly 100 can subsequently be removed. In order that the electronics housing assembly 100 is further usable after removal, the bus plugs 2 of the adjacent electronics housings 101 and 103 are subsequently connected to one another by a second longer power rail strip 300.3.

The width D of the all of the electronics housings is the same. A second power rail strip 300.3 can therefore be used, the length L3 of which is computed from the total of the lengths L1, L2 of the removed power rail strips 300.1, 301.1, 300.2, 301.2 plus the uniform electronics housing width EB.

However, the removed electronics housing E can also be replaced by a replacement electronics housing (not shown).

Figure 14:
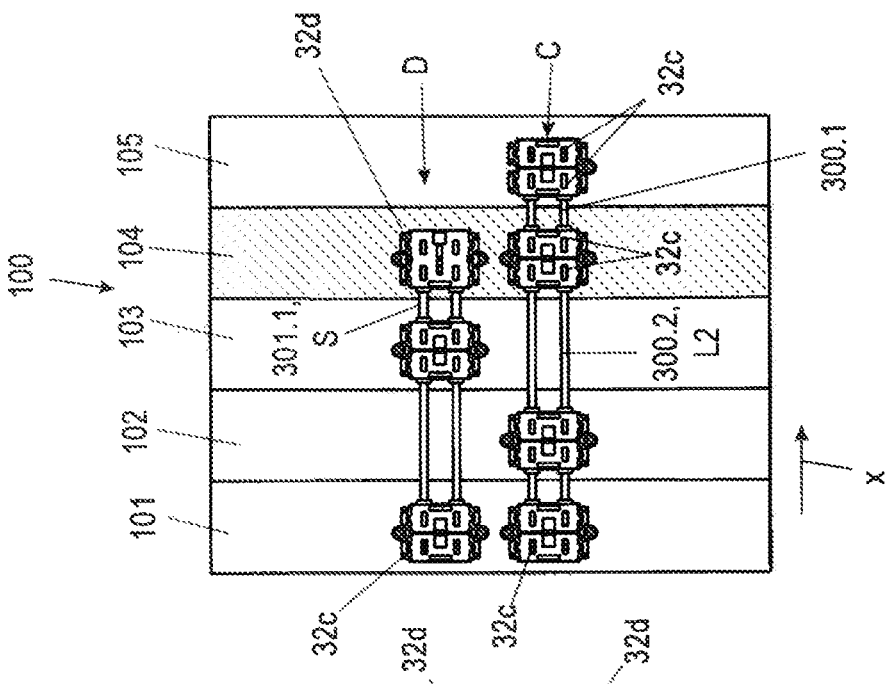
FIG. 14 is a plan view of a further electronics housing assembly having a plurality of electronics housings arranged against one another in an array and a contact an busbar assembly.

FIG. 14 shows a further electronics housing assembly 100 having multiple electronics housings 101-105 arranged against one another in the array direction X and a contact and busbar assembly according to the invention.

In relation to the electronics housing assembly 100 of FIG. 13, the electronics housing assembly 100 of FIG. 14 has a further electronics housing 105. A feed electronics housing 104 used as a feed module (not identified) is arranged in front of the additional electronics housing 105 in the array direction X.

The covers 32c, 32d used on the feed electronics housing 104 have a different connecting width AB as shown in FIG. 12. The covers 32d of an upper part D of the contact and busbar assembly 1' of the electronics housing assembly of FIG. 14 have a connecting width corresponding with the connecting width AB of the second connecting contacts K2 of the bus plugs 2'. The covers 32c of a lower part C of the contact and busbar assembly 1' of the electronics housing assembly of FIG. 14 have half of the connecting width AB of the second connecting contacts K2.

The power rail strips 300, 301 extend completely through the covers 32c, 32d. They have a connecting portion 36, 36' on each of the opposing ends thereof. This is shown in FIG. 6a in the example of partially flexible power rail strips 30, 30'. In this embodiment, the power rail strips 30 have an extended connecting portion 36' at one end, the connecting length AL of which is twice as long as the connecting length AL of the connecting portion 36 at its other end. The doubled connecting length AL generally corresponds to the connecting width AB of a second connecting contact K2. Such a power rail strip is also referred to as a feed power rail strip S.

Such feed power rail strips S are provided at the upper part D of the contact and busbar assembly 1' of the electronics housing assembly of FIG. 14. The connecting portion 36' of the feed power rail strips engages the entire second connecting contact K2. More power can thus be fed into the power rails 300, 301.

If the connecting length AL of the connecting portion 36 corresponds to generally half of the connecting width AB of the second connecting contact K2 of the bus plug 2', two power rail strips 300, 301 arranged against one another in the array direction X can be plugged in succession into the same second connecting contact K2. This is shown in the lower part D of the contact and busbar assembly 1' of the electronics housing assembly of FIG. 14 for T-type energy distribution. However, the power which can be fed is less.

While the preferred forms and embodiments of the invention have been illustrated and described, it will be apparent to those of ordinary skill in the art that various changes and modifications may be made without deviating from the inventive concepts set forth above.

What is claimed is:

1. A contact and busbar assembly for forming a bus system on a plurality of electronics housings each including a circuit board and being arranged adjacent one another in an array direction, comprising
   (a) a plurality of bus plugs connected with the electronics housings, each bus plug having first connecting contacts for electrically contacting the circuit boards and second connecting contacts; and
   (b) a plurality of power rail strips for electrically connecting said second connecting contacts of said bus plugs of the electronics housings, at least one first power rail strip of said plurality of power rail strips electrically connecting said bus plugs of two directly adjacent electronics housings and at least one second power rail strip of greater length than a length of said at least one first power rail strip for electrically connecting said bus plugs of two of the electronics housings which are spaced from each other in a non-adjacent arrangement.

2. The contact and busbar assembly as claimed in claim 1, characterized wherein the length of the at least one second power rail strip is longer than the length of the at least one first power rail strip by a distance corresponding with a width of at least one electronics housing.

3. The contact and busbar assembly as claimed claim 1, wherein said power rail strips each have a connecting portion on the opposite ends thereof, a connecting length of which corresponds to approximately half of a connecting width of a second connecting contact of the bus plug.

4. The contact and busbar assembly as claimed in claim 1, and further comprising a feed power rail strip having an extended connecting portion.

5. The contact and busbar assembly as claimed in claim 4, wherein a connecting length of the extended connecting portion of said feed power rail strip corresponds with a connecting width of said second connecting contact of said bus plug.

6. An electronics housing assembly comprising a plurality of electronics housings arranged against one another in an array direction and a contact and busbar assembly as claimed in claim 1.

7. A method for removing or replacing a selected electronics housing arranged between two adjacent electronics housings of an electronics housing assembly on either side of the selected electronics housing as claimed in claim 6, wherein said bus plug of the selected electronics housing is connected with said bus plugs of other electronics housings of the electronics housing assembly by first and second power rail strips, comprising the steps of
   (a) removing said first and second power rail strips which connect the selected electronics housing to the other electronics housings, respectively;
   (b) removing the selected electronics housing from the electronics housing assembly; and
   (c) connecting said bus plugs of the other electronics housings to one another by a third power rail strip having a length eater than said first power rail strip.

8. The method as claimed in claim 7, wherein the length of said third powder rail strip is computed from the total of the lengths of said removed power rail strips plus the electronics housing width of the selected electronics housing.

* * * * *